US010714294B2

(12) United States Patent
Hill et al.

(10) Patent No.: US 10,714,294 B2
(45) Date of Patent: Jul. 14, 2020

(54) METAL PROTECTIVE LAYER FOR ELECTRON EMITTERS WITH A DIFFUSION BARRIER

(71) Applicant: KLA-TENCOR CORPORATION, Milpitas, CA (US)

(72) Inventors: Frances Hill, Sunnyvale, CA (US); Gildardo R. Delgado, Livermore, CA (US); Rudy F. Garcia, Union City, CA (US); Gary V. Lopez Lopez, Sunnyvale, CA (US); Michael E. Romero, San Jose, CA (US); Katerina Ioakeimidi, San Francisco, CA (US); Zefram Marks, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/419,184

(22) Filed: May 22, 2019

(65) Prior Publication Data

US 2019/0362927 A1    Nov. 28, 2019

Related U.S. Application Data

(60) Provisional application No. 62/676,735, filed on May 25, 2018.

(51) Int. Cl.
*H01J 1/16* (2006.01)
*H01J 1/304* (2006.01)
*H01J 37/073* (2006.01)

(52) U.S. Cl.
CPC .......... *H01J 1/3044* (2013.01); *H01J 37/073* (2013.01); *H01J 2201/3048* (2013.01); *H01J 2201/30411* (2013.01); *H01J 2201/30426* (2013.01); *H01J 2201/30449* (2013.01); *H01J 2237/06341* (2013.01)

(58) Field of Classification Search
None
See application file for complete search history.

(56) References Cited

U.S. PATENT DOCUMENTS

| 5,800,233 | A | | 9/1998 | Yano et al. | |
|---|---|---|---|---|---|
| 6,052,267 | A | * | 4/2000 | Kasai | H01J 9/025 361/111 |
| 6,570,305 | B1 | * | 5/2003 | Urayama | H01J 1/3044 313/309 |
| 2006/0055302 | A1 | | 3/2006 | Chen | |
| 2008/0261337 | A1 | | 10/2008 | Tolt | |
| 2008/0287030 | A1 | | 11/2008 | Kim et al. | |
| 2018/0005791 | A1 | | 1/2018 | Schultz et al. | |

(Continued)

FOREIGN PATENT DOCUMENTS

KR    100223057 B1    10/1999

OTHER PUBLICATIONS

WIPO, ISR for PCT/US2019/033865, Oct. 22, 2019.

*Primary Examiner* — Vip Patel
(74) *Attorney, Agent, or Firm* — Hodgson Russ LLP

(57) ABSTRACT

An emitter with a diameter of 100 nm or less is used with a protective cap layer and a diffusion barrier between the emitter and the protective cap layer. The protective cap layer is disposed on the exterior surface of the emitter. The protective cap layer includes molybdenum or iridium. The emitter can generate an electron beam. The emitter can be pulsed.

16 Claims, 15 Drawing Sheets

(56) References Cited

U.S. PATENT DOCUMENTS

| | | |
|---|---|---|
| 2018/0174794 A1 | 6/2018 | Delgado et al. |
| 2018/0374669 A1* | 12/2018 | Akinwande ............ H01J 37/073 |
| 2019/0108963 A1* | 4/2019 | Hill ......................... H01J 40/06 |
| 2019/0108964 A1 | 4/2019 | Ioakeimidi et al. |
| 2019/0108966 A1 | 4/2019 | Delgado et al. |

* cited by examiner

Provide an emitter that includes a protective cap layer disposed on an exterior surface of the emitter, wherein the emitter has a diameter of 100 nm or less, and wherein the protective cap layer includes molybdenum or iridium

300

Apply an electric field to the emitter

301

Generate an electron beam from the emitter

METAL PROTECTIVE LAYER FOR ELECTRON EMITTERS WITH A DIFFUSION BARRIER

CROSS-REFERENCE TO RELATED APPLICATIONS

This application claims priority to the provisional patent application filed May 25, 2018 and assigned U.S. App. No. 62/676,735, the disclosure of which is hereby incorporated by reference.

FIELD OF THE DISCLOSURE

This disclosure relates to electron emitters with a coating.

BACKGROUND OF THE DISCLOSURE

Emitters with small tip diameters (e.g., 100 nm or less) used for electron emission are affected by vacuum conditions. The vacuum conditions can deteriorate field emission performance. Typical electron emitters do not have protective coating to protect from oxidation or carbon build up. A carbon layer grows on the surface of the cathode tips during electron beam emission under ultra-high vacuum (UHV) conditions. Oxidation of surfaces in UHV environments is also likely. Previous designs were not robust to cleaning of, for example, oxidation or carbon layers. Molecules from the vacuum (e.g., hydrogen, carbon monoxide, oxygen, nitrogen, and water) also can adsorb onto the cathode tip, and this can lead to a drop in the field emission current and instability in the field emission current.

Silicon is a good candidate material for making nanotips to be used as electron emitters because of well-established silicon microfabrication techniques. However, silicon emitters are highly susceptibility to oxidation, which converts the emitter tip to a silicon oxide. The silicon oxide will render the tip inoperable for electron emission due to the high work function of the silicon oxide. Stability also is affected by presence of silicon oxide on the emitter. There is no clear method to prevent this from occurring over the system lifetime.

Therefore, what is needed is an improved electron emitter and methods of operation.

BRIEF SUMMARY OF THE DISCLOSURE

An apparatus is provided in a first embodiment. The apparatus includes an emitter which has a diameter of 100 nm or less. A protective cap layer is disposed on an exterior surface of the emitter. The protective cap layer includes molybdenum. The emitter can have a diameter of less than 15 nm. The protective cap layer can have a thickness from 1 nm to 20 nm.

A diffusion barrier may be disposed between the emitter and the protective cap layer. The diffusion barrier can include TiN, carbon, $B_4C$, boron, or niobium.

The protective cap layer may be free of pinholes in at least an emitting area.

The protective cap layer may have fewer than $10^4$ impurities. The impurities can include carbon, oxides, oxygen as a dissolved gas, sodium, or potassium.

The protective cap layer can have a porosity less than or equal to 25%.

The protective cap layer can have a packing density of greater than or equal to 0.92.

A system can include an electron source with the emitter of the first embodiment, a stage, and a detector.

An apparatus is provided in a second embodiment. The apparatus includes an emitter which has a diameter of 100 nm or less. A protective cap layer is disposed on an exterior surface of the emitter. The protective cap layer includes iridium. The emitter can have a diameter of less than 15 nm. The protective cap layer can have a thickness from 1 nm to 20 nm.

A diffusion barrier may be disposed between the emitter and the protective cap layer. The diffusion barrier can include TiN, carbon, $B_4C$, boron, or niobium.

The protective cap layer may be free of pinholes in at least an emitting area.

The protective cap layer may have fewer than $10^4$ impurities. The impurities can include carbon, oxides, oxygen as a dissolved gas, sodium, or potassium.

The protective cap layer can have a porosity less than or equal to 25%.

The protective cap layer can have a packing density of greater than or equal to 0.92.

A system can include an electron source with the emitter of the second embodiment, a stage, and a detector.

A method is provided in a third embodiment. The method includes providing an emitter that includes a protective cap layer disposed on an exterior surface of the emitter. The emitter has a diameter of 100 nm or less. An electric field is applied to the emitter. An electron beam is generated from the emitter. The emitter is pulsed, which removes adsorbates from the emitter.

The protective cap layer can include molybdenum, iridium, ruthenium, or other materials.

DESCRIPTION OF THE DRAWINGS

For a fuller understanding of the nature and objects of the disclosure, reference should be made to the following detailed description taken in conjunction with the accompanying drawings, in which:

FIG. 3 is a flowchart of another method in accordance with the present disclosure;

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein provide an emitter with high electron current stability and lifetime and methods of emitter operation. As disclosed herein, the tip of the emitter is coated with a protective cap layer of molybdenum and/or iridium. Molybdenum and iridium coated silicon tips produce higher emission current and have better emission current stability compared to n-type silicon or p-type silicon emitters. In addition, the molybdenum and iridium surfaces can be cleaned of carbon contamination and oxidation using molecular hydrogen, molecular hydrogen with heating, hydrogen plasmas, or other plasmas. The embodiments disclosed herein can be retrofitted into existing systems, which reduces redesign costs.

The protective cap layer is selected so that adsorbed molecules can be easily cleaned from the metal and so that metal surface stays clean longer than without a protective cap layer. Molecular adsorbates can be cleaned from the tips by heating, ultraviolet light, electron stimulated desorption, or using high electric fields. Even under ultra-high vacuum conditions, growth of carbon layers on the surface of silicon cathode tips without a protective cap layer can still occur during electron beam emission, and oxidation of these surfaces is also likely. The protective cap layer is resistant to oxidation and carbon build up.

Figure 1:
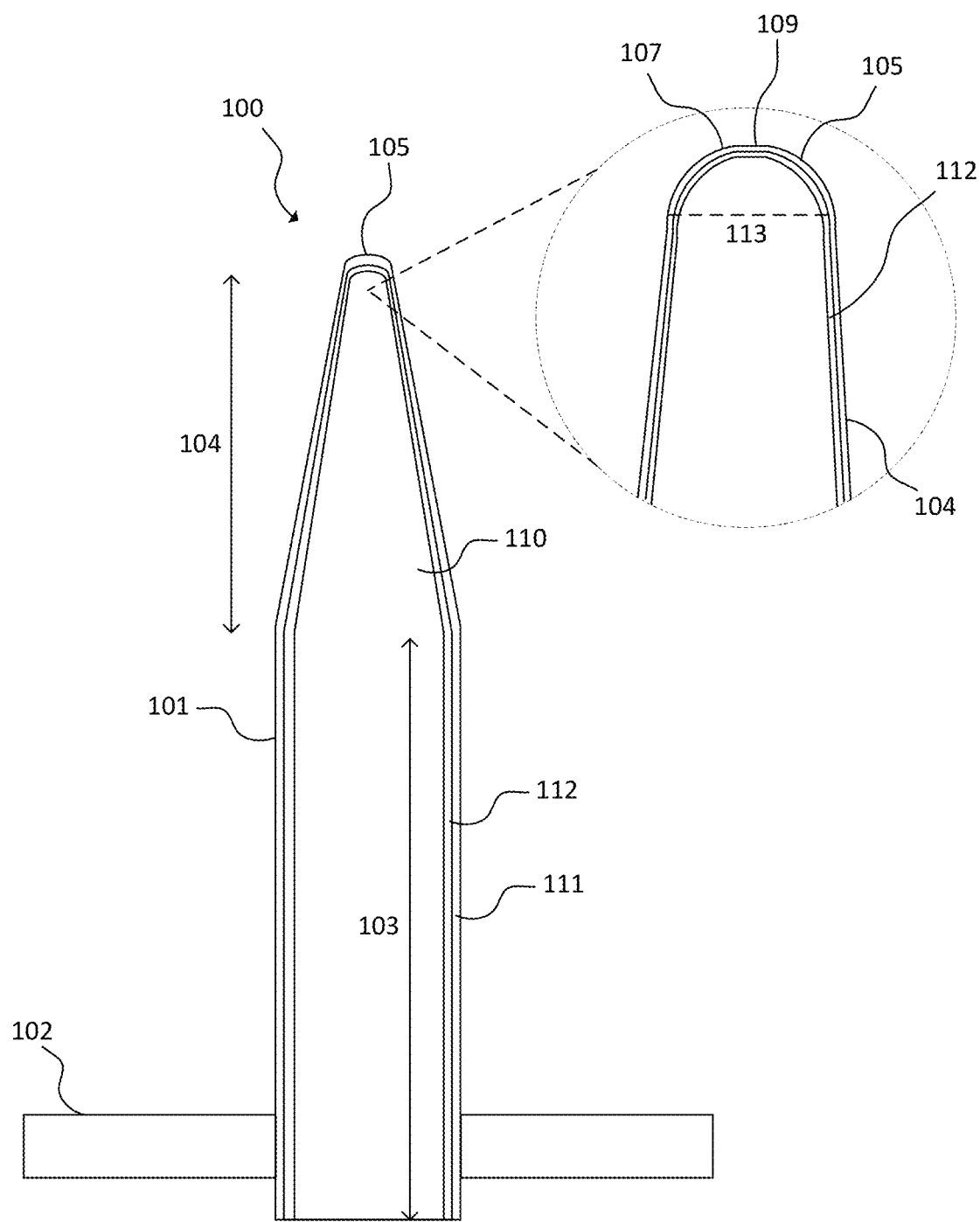
FIG. 1 is a front view of an embodiment of an electron emittance system in accordance with the present disclosure.

FIG. 1 is a front view of an electron emittance system 100, which includes an emitter 101 and emitter mounting mechanism 102. The electron emittance system 100 is configured to emit electrons into the environment or space around the electron emittance system 100. The emitter 101 has a first section 103, a second section 104, and a rounded tip 105. The first section 103 can be cylindrical. Without the rounded tip 105, the second section 104 can be generally frustoconical. The second section 104 can be disposed on a distal end of a first section 103. The second section 104 can have a tapering width or diameter between the first section 103 and the rounded tip 105. While the first section 104 and second section 105 can be generally round, both the first section 104 and second section 105 may be faceted due to the crystal structure. The rounded tip 105, which is disposed on a distal end of the second section 104, may generally be a truncated sphere. The rounded tip 105 can be at least partly or fully rounded. Other shapes than those described herein are possible.

The first section 103 or the first section 103 and second section 104 can be described as the "shaft" of the emitter 101. The shaft of the emitter 101 is held by the emitter mounting mechanism 102.

The dimensions of the emitter 101, first section 103, second section 104, or rounded tip 105 can vary. The shaft of the emitter 101 or the emitter 101 itself can be on the nanometer scale or the micron scale with respect to both length and diameter.

The emitter 101 includes an emitter core 110 and a protective cap layer 111. The protective cap layer 111 is disposed on an outer surface of the emitter core 110. An entirety or less than an entirety of the outer surface of the emitter core 110 may be covered by the protective cap layer 111. Thus, 100% or less than 100% of the exposed surface of the emitter 101 may be covered by the protective cap layer 111. However, at least the rounded tip 105 of the emitter 101 or at least the emitting area of the emitter 101 may be covered by the protective cap layer 111.

The emitter core 110 may be silicon or other materials. The protective cap layer 111 can be molybdenum, iridium, or an alloy of molybdenum and iridium. Other materials also can be alloyed with molybdenum and/or iridium. The molybdenum or iridium may be >90% pure, such as >99% pure. In an instance, a silicon cold field emitter is constructed using a microfabrication process. Then a sputtered molybdenum and/or iridium thin film is deposited onto the silicon cold field emitters.

An optional diffusion barrier 112 can be disposed between the emitter 101 and the protective cap layer 111. The diffusion barrier 112 prevents or reduces diffusion between the emitter core 110 and the protective cap layer 111. The diffusion barrier 112 may be, for example, TiN, carbon, $B_4C$, boron, niobium, or other materials. The thickness of the diffusion barrier 112 can be selected to prevent or reduce diffusion of, for example, metals into the silicon of the emitter core 110. In an instance the diffusion barrier 112 has a thickness from 1-2 nm, but thicker layers are possible. A thicker diffusion barrier 112 may result in lower brightness, but this may be acceptable for certain applications. Oxygen content in the diffusion barrier 112 may be controlled to minimize the amount of oxygen that is present. In an instance, an argon plasma is used to remove a metal oxide from the emitter 101 before the diffusion barrier 112 is applied. In an example, the argon plasma, diffusion barrier 112, and protective cap layer 101 are applied in the same chamber without breaking vacuum.

The protective cap layer 111 also can be applied directly to the emitter 101 without the diffusion barrier 112. For example, a molybdenum protective cap layer 111 was tested on an emitter 101 without a diffusion barrier 112 with acceptable performance.

The protective cap layer 111 can render the emitter 101 resistant to oxidation and carbon build-up. The protective cap layer 111 also can have relatively low sputter yields to withstand erosion by ions. Molybdenum and iridium thin films can be cleaned of carbon build-up and oxidation using molecular hydrogen, molecular hydrogen with heating, hydrogen plasmas, or other plasmas. The protective cap layer 111 can have low sputter yields so it can withstand erosion by ions. Molybdenum and iridium also have low sputter yields, which means these thin films can withstand erosion by ions. Low sputter yields make molybdenum and iridium good candidates to protect the emitter tips from ion bombardment caused by backstreaming ions.

Both molybdenum and iridium have high melting temperatures (approximately 2623° C. for molybdenum and approximately 2446° C. for iridium). A high melting temperature can enable the protective cap layer 111 to be thermodynamically stable. Recrystallization during heating is undesirable for the protective cap layer 111. The protective cap layer 111 may need to emit up to hundreds of microamperes of current without any structural change to the film due to heating (e.g., Joule heating and/or Nottingham effect during field emission). The deposited protective cap layer 111 should preferably be stable when the emission is run in warm field emission mode (e.g., heating the emitter up to about 500° C.) and when the vacuum chamber is heated during a bake to reach vacuum levels of $10^{-11}$ to $10^{-10}$ Torr (e.g., heating up to 300° C.).

The configuration of the emitter mounting mechanism 102 can vary from that illustrated in FIG. 1. In an example, an emitter mounting mechanism 102 supports the emitter tip using a tungsten hairpin seated on a ceramic insulator with electrodes for the hairpin legs. The hairpin can be heated to either provide flash cleaning or to raise the emitter temperature to thermal field emission (TFE) values (e.g., approximately 1800 K). A ground-referenced power supply can provide the bias voltage for the emitter, which may be approximately 5 kV. In an instance, a bias voltage from 1-2 kV is used.

The rounded tip 105 is configured to emit free electrons into an evacuated space around the electron emittance system 100. Electrons can be generated by applying an electric field to or around the electron emittance system 100. The electric field can be applied using charged plates or using other techniques.

The emitter 101 can have an emitting area less than 1 μm$^2$. For example, the emitting area of the emitter 100 may be 100 nm$^2$ or smaller. This emitting area may be part of the outer surface 107 of the rounded tip 105.

The rounded tip 105 may be uniformly rounded or non-uniformly rounded. The rounded tip 105 may include a flat emitting facet 109. For example, there may be a flat emitting facet 109 in the form of a small <100> orientation nano-flat. This flat emitting facet 109 can be used to generate a well-collimated electron beam. In an example, the flat emitting facet 109 can provide an emitting area less than 1 μm$^2$.

In other examples, the rounded tip 105 has a generally hemispherical or paraboloidal shape, which may or may not include a flat emitting facet. These shapes may disperse electron emission more broadly, which can result in a smaller, brighter fraction of electrons that pass into the electron optics.

To provide the desired rounded tip 105, surface crystallinity may be controlled.

The thickness of the molybdenum and iridium films can be designed for improved electron emission. The emitter tip diameter after the coating of the protective cap layer 111, such as illustrated by line 113 in FIG. 1, may be small so that the electron beam has high brightness. Thus, the thickness of the protective cap layer 111 may be thin. A molybdenum and/or iridium coating with thickness from 1 nm to 20 nm may be used, including all values to the 0.1 nm and ranges between. The exact thickness can depend on the initial tip diameter of the emitter 101. For example, molybdenum and iridium protective cap layers ranging from 1 nm to 20 nm in thickness can be used for a tip radius ranging from 1 nm to 50 nm. Thicker protective cap layers are possible if reduced brightness is acceptable. In an instance, a 10 nm thick protective cap layer 111 was tested with a 2 nm thick diffusion barrier 112. A dense coating can be deposited by ion or magnetron sputtering, atomic layer deposition (ALD), or by other methods that allow for a dense, uniform protective cap layer 111. A dense coating can be, for example, homogenous, uniform, and have a packing density greater than approximately 80%. A protective cap layer 111 thicker than 20 nm also can be used because the thickness can depend on the radius of the emitter 101.

Diameter at the outer surface of the protective cap layer 111 may be controlled to tune the properties of the electron beam (e.g., brightness, electric field at the tip, current-voltage properties, electron-electron interactions). The diameter at the outer surface of the protective cap layer 111 is made up of the sum of the diameter of the emitter core 110 and the thickness of the protective cap layer 111 on both sides of a cross-section of the emitter 101 and the optional diffusion barrier 112 on both sides of a cross-section of the emitter 101. When selecting the diameter of the emitter core 110, there are fabrication issues to consider such as ease of fabrication, repeatability, and variability of dimensions between emitters. When selecting the thickness of the protective cap layer 111, the quality of the film, such as the grain structure, grain boundaries, discontinuities, surface coverable, pinholes, film density, or surface roughness, may be controlled. It may be important that the protective cap layer 111 coating the emitter be uniform, dense, continuous, and have very low surface roughness, particularly at the tip of the emitter 101. The protective cap layer 111 also may be uniform and conformal on the sidewalls. To handle electric field penetration, the lower bound of the protective cap layer 111 thickness may be one monolayer. Above one monolayer, the film thickness can be chosen to optimize the film quality. The total diameter of the emitter core 110 plus the protective cap layer 111 can be chosen to optimize the electron beam properties.

The emitting area of the rounded tip 105 can be less than 1 μm$^2$. The emitting area of the rounded tip 105 can correspond to the entire surface area of the rounded tip 105 or just part of the surface area of the rounded tip 105. For example, the emitting area may correspond to a flat emitting facet 109. The emitting area of the rounded tip 105 may not have protrusions and can be atomically smooth.

All or part of the protective cap layer 111 can be free of pinholes. For example, at least the emitting area of the emitter 101 may be free of pinholes. The emitting area may be the 5-10 nm region near the tip or other areas. The effect of any pinholes can be magnified by the high extraction fields necessary to pull the electron beam.

All or part of the protective cap layer 111 can be free of inclusions. For example, at least the emitting area of the emitter 101 may be free of inclusions.

A maximum imperfection diameter or length dimension in the protective cap layer 111 may be less than 1 nm. Imperfections include excessive structure in the deposited film, such as rods or lumps that can be controlled via sputtering parameters.

The protective cap layer 111 can have fewer than 10$^3$ or 10$^4$ impurities. Impurities can include carbon, oxides, oxygen as a dissolved gas, sodium, potassium, or other materials. Impurities affect the work function of the protective cap layer 111, which will affect uniformity of the electron emission.

Porosity of the protective cap layer 111 may be less than or equal to 25%. Packing density of the protective cap layer 111 may be greater than or equal to 0.92. Porosity (P) can be defined and measured using index of refraction with the following equation $$P(\%) = \left(1 - \left(\frac{n_f^2}{n_B^2} - 1\right)\right) * 100\%$$ Eq. 1 wherein where $n_f$ is the refractive index of deposited thin film and $n_B$ is the refractive index of the bulk material.

Packing density (PD) of a film is defined as a ratio of the average film density ($\rho_f$) and the bulk density ($\rho_B$) using the following equation.

$$PD = \rho_f/\rho_B \qquad \text{Eq. 2}$$

The correlation between the film refractive index and its packing density can be expressed by the following equation.

$$PD = \left(\left(\frac{n_f^2-1}{n_f^2+2} - \frac{n_B^2+2}{n_B^2-1}\right)\right) * 100\% \qquad \text{Eq. 3}$$

The surface of the emitter 101 where field emission occurs can be homogeneously made of metal atoms.

The protective cap layer 111 reduces carbon contamination and oxidation.

Molybdenum, iridium, or their alloys can be cleaned by molecular hydrogen, hydrogen plasmas, or other plasmas. Thus, any carbon contamination or oxidation on the protective cap layer 111 can be removed using, for example, $H_2^+$ with heat and/or oxygen.

A protective cap layer 111 that includes molybdenum or iridium is robust for electron field emission or in the presence of high electric fields. Such a protective cap layer 111 also is robust to ion sputtering and cleaning.

The protective cap layer 111 can be deposited by ion or magnetron sputtering, ALD, or by other methods known to those skilled in the art. These techniques can enable formation of a protective cap layer 111 with the desired density and uniformity.

Coating silicon with a molybdenum thin film can produce arrays of small diameter tips. Arrays of emitters with small diameters (e.g., 15 nm diameter or smaller) can be made using silicon microfabrication techniques. The silicon is coated with the metal thin film to metallize the emission surface. The coating technology can provide high density, high purity coatings with no structural imperfections. To prevent or reduce diffusion of the silicon into the metal thin film, a diffusion barrier can be deposited between the silicon and the metal thin film. This diffusion barrier is optional.

In one test, nanotips are mounted on top of tall cylindrical silicon pillars to increase the field enhancement. Nanotips and pillars can be examples of emitters. The silicon nanotips are coated with a metal thin film for cold field emission. An optional diffusion barrier is added between the silicon and the metal thin film to reduce or prevent silicon from diffusing into the metal thin film. This reduces or prevents silicon from diffusing to the emission surface where it can oxidize and cause a non-uniform work function. Resulting $SiO_2$ also can limit the current because of its high work function. While tested emitters were made from silicon, the emitters also can be made of other materials.

Of the different metals coatings tested on silicon emitters, emitters with iridium protective cap layers have shown the most promising results for field emission stability. However, stability results for molybdenum and iridium are superior to platinum, ruthenium, boron, or tungsten thin films. Uniformity of a coating can affect stability, but test results indicate that performance is generally similar between molybdenum and iridium even with differences in uniformity. Thus, any differences in uniformity between iridium and molybdenum coatings may not affect performance.

Figure 2:
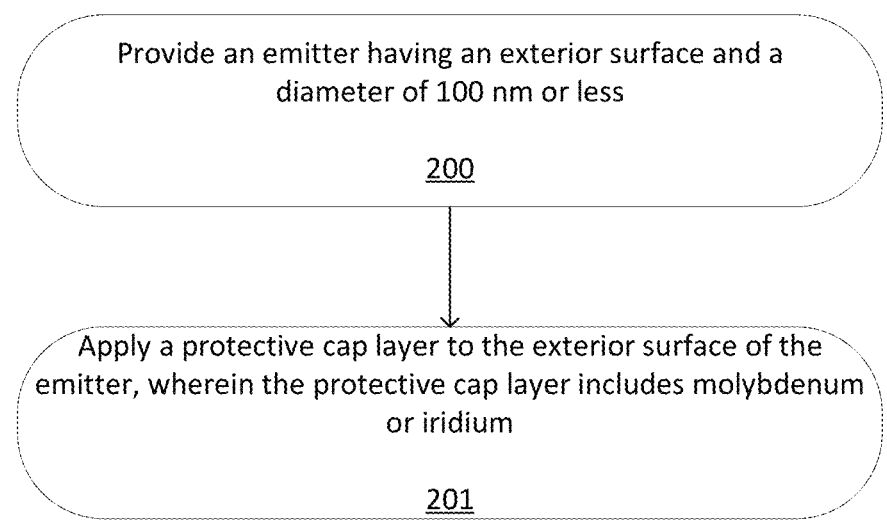
FIG. 2 is a flowchart of a method in accordance with the present disclosure.

FIG. 2 is a flowchart of a method in accordance with the present disclosure. At 200, an emitter having an exterior surface is provided. The emitter has a diameter of 100 nm or less. At 201, a protective cap layer is applied to the exterior surface of the emitter. The protective cap layer includes molybdenum and/or iridium. The applying can include sputter deposition, ALD, or ion sputtering. Sputter deposition and ALD can provide desired conformality of the protective cap layer. In particular, sputter deposition may reduce porosity, the presence of voids, and the presence of pinholes in the protective cap layer.

FIG. 3 is a flowchart of another method in accordance with the present disclosure. At 300, an emitter that includes a protective cap layer disposed on an exterior surface of the emitter is provided. The emitter has a diameter of 100 nm or less. The protective cap layer includes molybdenum and/or iridium. At 301, an electric field is applied to the emitter. At 302, an electron beam is generated from the emitter. The emitter may operate in a vacuum of at least $10^{-9}$ Torr, such as from $5\times10^{-10}$ Torr to $5\times10^{-11}$ Torr. Less than $5\times10^{-11}$ Torr is possible, such as $10^{-12}$ Torr.

An extraction voltage from approximately 0.1 kV to 10 kV may be used during electron beam generation, including all ranges and values to the 0.1 kV between. For example, the extraction voltage may be from approximately 0.5 kV to 10 kV, from approximately 1 kV to 10 kV, from approximately 1.5 kV to 10 kV, or from approximately 2.5 kV to 10 kV. Other extraction voltages are possible.

An electric field for an emitter with a protective cap layer can range from approximately 0.1 V/nm to 5 V/nm, including all ranges and values to the 0.1 V/nm between. The electric field can vary depending on the outer diameter of the emitter (including the thickness of the protective cap layer). Electric fields greater than 5 V/nm can be used for high currents (e.g., greater than 10 μA).

Embodiments of this disclosure can be used in reticle and wafer inspection and metrology systems. The systems can be configured to provide the desired vacuum environment specifications. Examples of these systems include electron beam wafer or reticle inspection systems using single or multiple electron sources; electron beam wafer or reticle review systems using single or multiple electron sources; electron beam wafer or reticle metrology systems using single or multiple electron sources; or systems which require at least one electron source for generation of x-rays using single or multiple electron beams for use in wafer or reticle metrology, review, or inspection. The electron stream from the emitter can be directed toward a sample, such as a semiconductor wafer or other workpiece. The electron stream may travel through extraction and focusing electrodes to form an electron beam with a desired beam energy and beam current. One or more lenses can be used to create a small electron beam spot on the sample. Deflectors can be used to scan the electron beam. The sample can be placed on a stage, which may be capable of scanning relative to the electron beam. Secondary electrons and back-scattered electrons can be emitted from the sample when the electron beam hits the sample, which can be collected and accelerated toward a detector.

Figure 4:
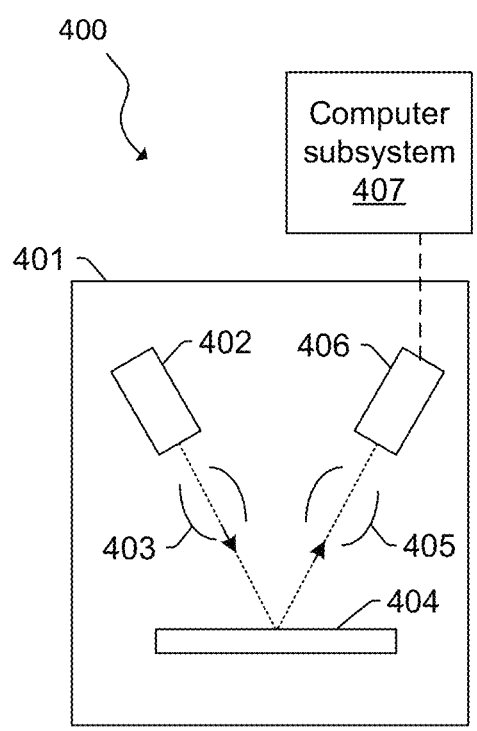
FIG. 4 is an embodiment of a system in accordance with the present disclosure.

The embodiments described herein may be included in or may be performed in a system, such as the system 400 of FIG. 4. The system 400 includes an output acquisition subsystem that includes at least an energy source and a detector. The output acquisition subsystem may be an electron beam-based output acquisition subsystem. For example, in one embodiment, the energy directed to the wafer 404 includes electrons, and the energy detected from the wafer 404 includes electrons. In this manner, the energy source may be an electron beam source 402. In one such embodiment shown in FIG. 4, the output acquisition subsystem includes electron column 401, which is coupled to computer subsystem 407.

As also shown in FIG. 4, the electron column 401 includes electron beam source 402 configured to generate electrons that are focused to wafer 404 by one or more elements 403. The electron beam source 402 may include an emitter, such as the emitter 101 of the electron emittance system 100 in FIG. 1, and one or more elements 403 may include, for example, a gun lens, an anode, a beam limiting aperture, a gate valve, a beam current selection aperture, an objective lens, and/or a scanning subsystem. The electron column 401 may include any other suitable elements known in the art. While only one electron beam source 402 is illustrated, the system 400 may include multiple electron beam sources 402.

Electrons returned from the wafer 404 (e.g., secondary electrons) may be focused by one or more elements 405 to detector 406. One or more elements 405 may include, for example, a scanning subsystem, which may be the same scanning subsystem included in element(s) 403. The electron column 401 may include any other suitable elements known in the art.

Although the electron column 401 is shown in FIG. 4 as being configured such that the electrons are directed to the wafer 404 at an oblique angle of incidence and are scattered from the wafer at another oblique angle, it is to be understood that the electron beam may be directed to and scattered from the wafer at any suitable angle. In addition, the electron beam-based output acquisition subsystem may be configured to use multiple modes to generate images of the wafer 404 (e.g., with different illumination angles, collection angles, etc.). The multiple modes of the electron beam-based output acquisition subsystem may be different in any image generation parameters of the output acquisition subsystem.

Computer subsystem 407 may be in electronic communication with the detector 406. The detector 406 may detect electrons returned from the surface of the wafer 404 thereby forming electron beam images of the wafer 404. The electron beam images may include any suitable electron beam images. Computer subsystem 407 may be configured to perform other functions or additional steps using the output of the detector 406 and/or the electron beam images. For example, the computer subsystem 407 can be configured to perform the method of FIG. 3 or the method of FIG. 8.

It is noted that FIG. 4 is provided herein to generally illustrate a configuration of an electron beam-based output acquisition subsystem. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system).

In one embodiment, the system 400 is an inspection system. For example, the electron beam output acquisition subsystems described herein may be configured as inspection systems. In another embodiment, the system 400 is a defect review system. For example, the electron beam output acquisition subsystems described herein may be configured as defect review systems. In a further embodiment, the system 400 is a metrology system. For example, the electron beam output acquisition subsystems described herein may be configured as metrology systems. In particular, the embodiments of the system 400 described herein and shown in FIG. 4 may be modified in one or more parameters to provide different imaging capability depending on the application for which they will be used. In one such example, the system 400 shown in FIG. 4 may be configured to have a higher resolution if it is to be used for defect review or metrology rather than for inspection. In other words, the embodiment of the system 400 shown in FIG. 4 describe some general and various configurations for an system 400 that can be tailored in a number of manners to produce output acquisition subsystems having different imaging capabilities that are more or less suitable for different applications.

Embodiments of the system 400 or electron emittance system 100 may be configured for inspection, defect review, and/or metrology of specimens such as wafers and reticles. For example, the embodiments described herein may be configured for using both scanning electron microscopy (SEM) for the purposes of mask inspection, reticle inspection, reticle metrology, wafer inspection, and wafer metrology. The system 400 or electron emittance system 100 also can be configured as electron sources for the generation of x-rays for wafer or reticle metrology, review, or inspection.

In particular, the embodiments described herein may be used with a computer node or computer cluster that is a component of or coupled to an output acquisition subsystem such as an electron beam inspector or defect review tool, a mask inspector, a virtual inspector, or other devices. In this manner, the embodiments described herein may generate output that can be used for a variety of applications that include, but are not limited to, wafer inspection, mask inspection, electron beam inspection and review, metrology, or other applications. The characteristics of the system 400 shown in FIG. 4 can be modified as described above based on the specimen for which it will generate output.

The optimal total pressure for operation of emitters for room temperature field emission, warm temperature field emission, or photocathode mode may be $10^{-9}$ Torr or less, such as such as from $5 \times 10^{-10}$ Torr to $5 \times 10^{-11}$ Torr. This operating pressure sums all of the partial pressures of vacuum relevant molecules (e.g., $H_2O$, $H_2$, $CO$, $CO_2$, $O_2$, $N_2$, or hydrocarbons). For $H_2$, the partial pressure limit may be $10^{-12}$ Torr, whereas for any other molecules, the partial pressure may be below $10^{-10}$ Torr.

The operating pressure may vary with operation mode. For example, operating pressure may vary with emission mechanism and surface activation energy. Thermal field emission mode may operate at $10^{-9}$ Torr or less, such as such as from $5 \times 10^{-10}$ Torr to $5 \times 10^{-11}$ Torr. Less than $5 \times 10^{-11}$ Torr is possible, such as $10^{-12}$ Torr.

The operating pressure or other vacuum parameters affect contamination or erosion of the emitter. High particle count for the environments around the emitter, such as those caused by moisture or other particles, can result in accelerated mass loss. Work-function emitting areas can disappear and emission can fall off to near zero because only high work function surfaces are exposed to the extracting field. Any pitting of the emitting material can be crystallographically-disrupted, which affects work function.

For example, carbon contamination of emitting surfaces, especially at lower operating temperatures, can occur when a thin layer of carbon forms on the electron stream emitting surface. Carbon contaminants can be caused by volatile vacuum system related organics (e.g., oils or lubricants), residue from polishes or cleaners, residual fibers from cotton swabs or cleaning cloths, or other sources. The carbon film poisons the emitting surface with a high work function layer, which results in reduced emitted current.

In another example, oxidation, sublimation, or evaporation of material from the emitter can occur due to moisture. Consequently, refractory or dielectric material can form on other surfaces, including internal surfaces, apertures, and anode surfaces.

To avoid carbon contamination, moisture damage, or oxidation, the vacuum environment around the electron emittance system is controlled. The operating pressure of the environment can depend on the operating mode.

Figure 5:
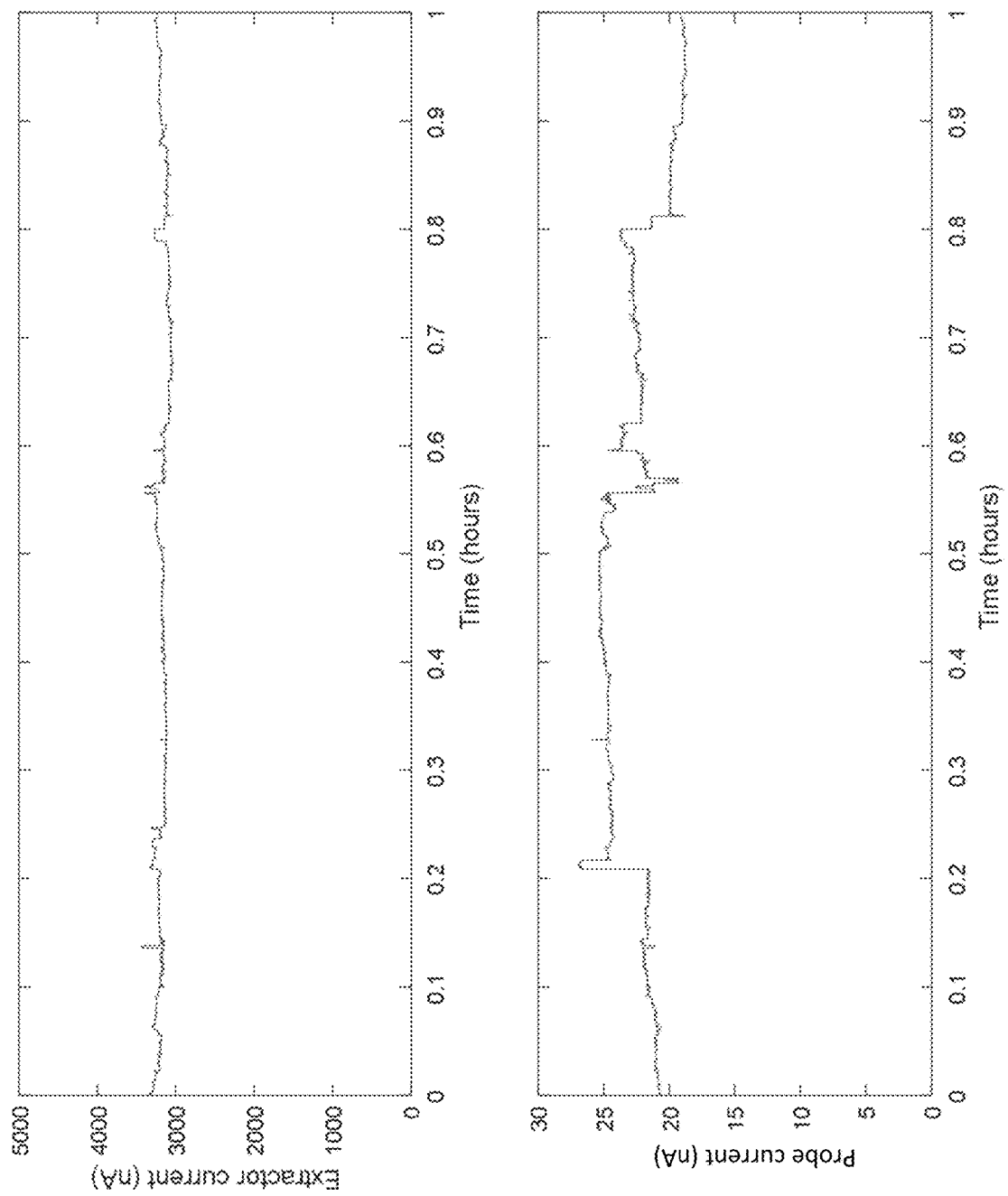
FIG. 5 shows experimental results for extractor current and probe current.
Figure 6:
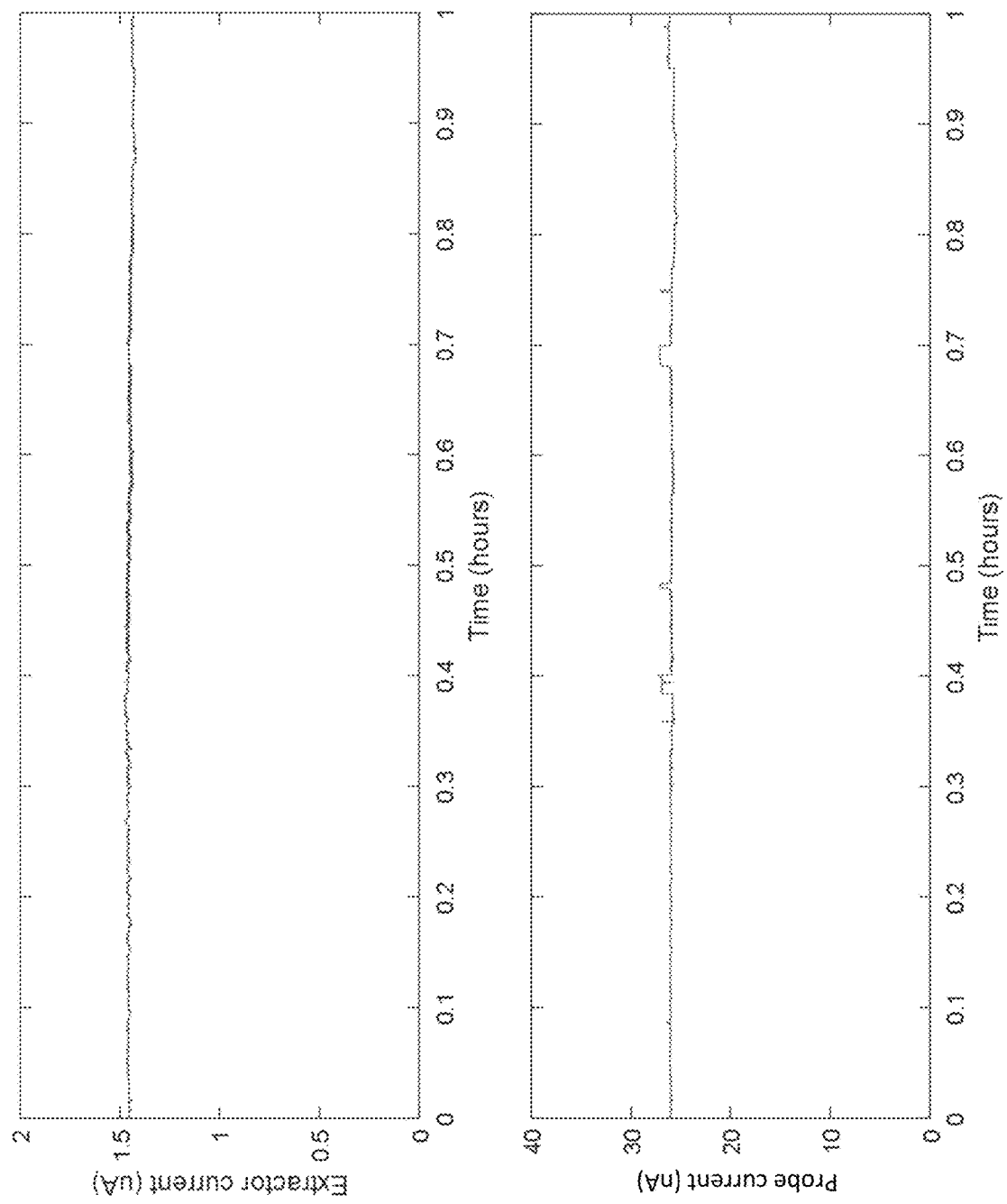
FIG. 6 shows experimental results for extractor current and probe current in another example.

FIG. 5 shows experimental results for extractor current and probe current (e.g., at a Faraday cup) for field emission with a 5 nm thick molybdenum protective cap layer on a silicon emitter without a diffusion barrier. FIG. 6 shows experimental results for extractor current and probe current (e.g., at a Faraday cup) in another example with a 5 nm thick iridium protective cap layer on silicon emitter with a $B_4C$ diffusion barrier between the protective cap layer and the emitter. In these experimental results, maximum currents of 60 µA to 120 µA were demonstrated with no lifetime issues. The emitters ran reliably and turned on instantly without settling time.

Figure 7:
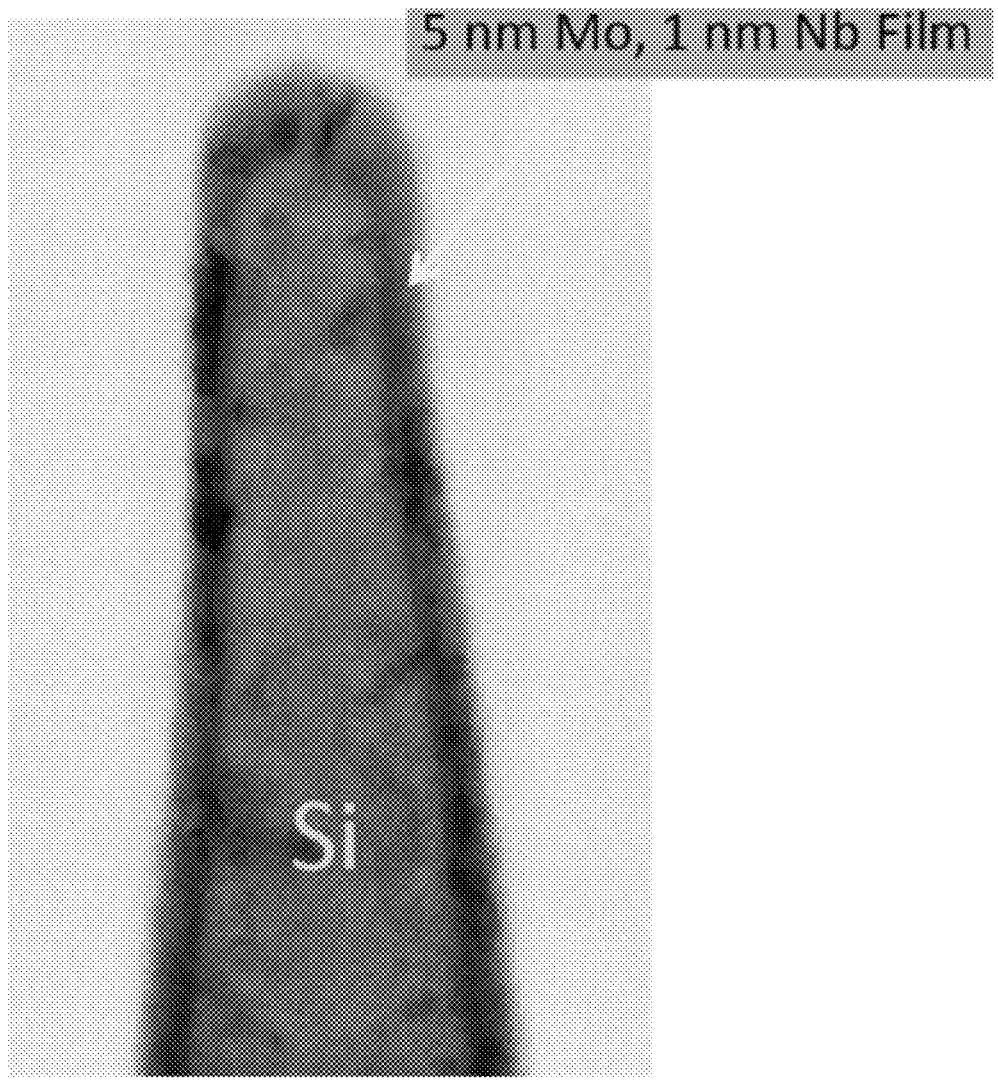
FIG. 7 shows a bright field image of a silicon emitter with a 5 nm molybdenum film deposited on a 1 nm niobium film.
Figure 14:
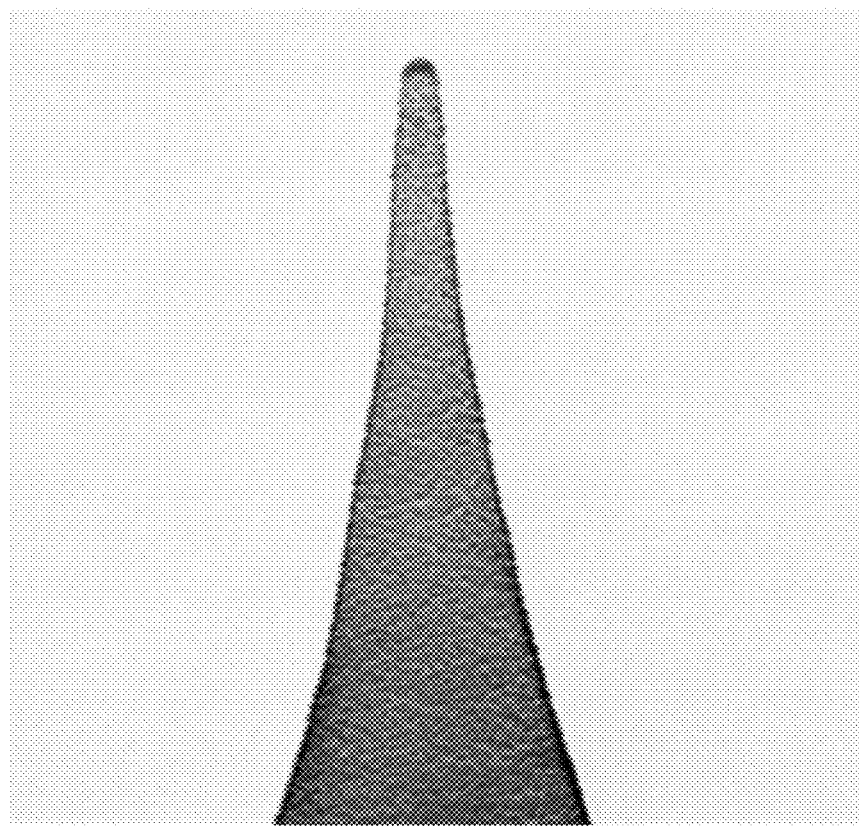
FIG. 14 illustrates a bright field image of a silicon emitter with an iridium film deposited on it.

FIG. 7 shows a bright field image of a silicon emitter with a 5 nm molybdenum film deposited on a 1 nm niobium film. FIG. 14 illustrates a bright field image of a silicon emitter with an iridium film deposited on it.

Figure 8:
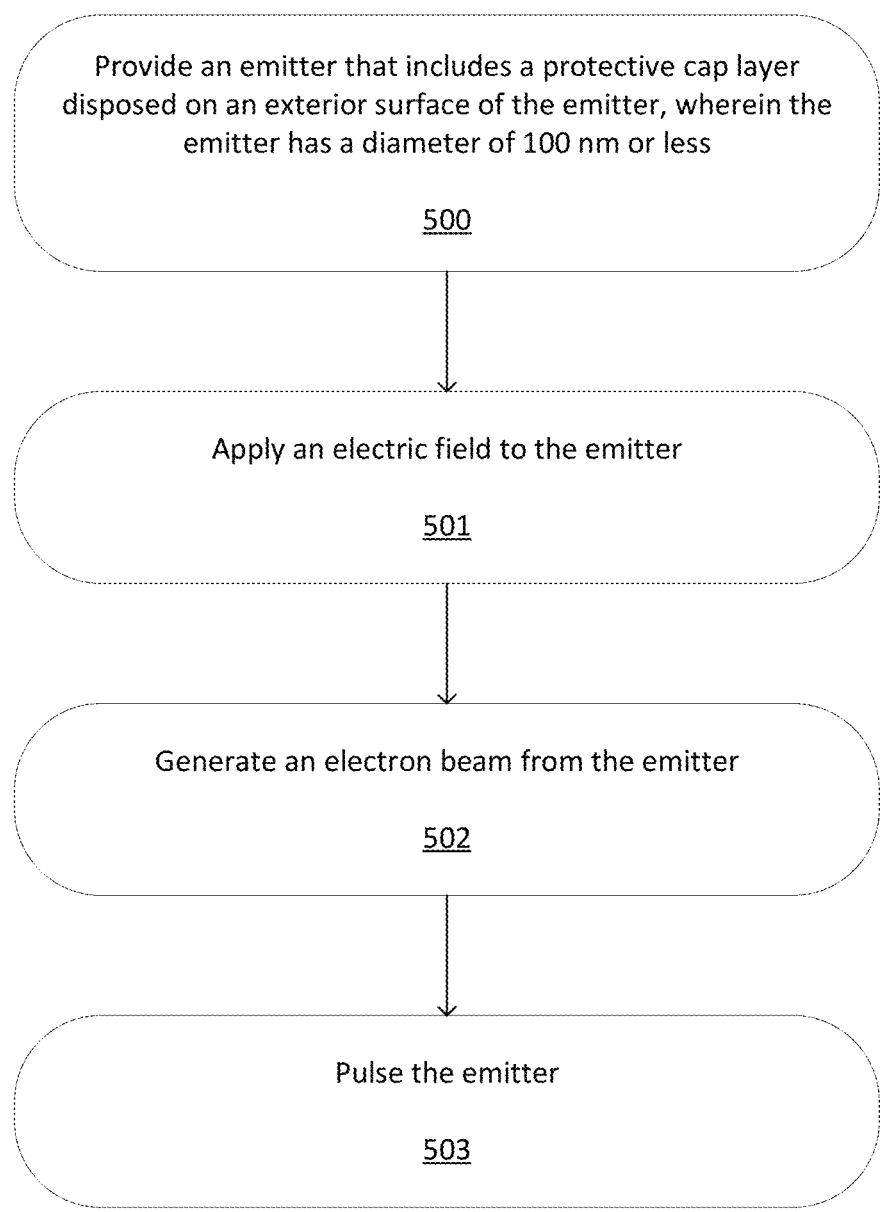
FIG. 8 is a flowchart of another method in accordance with the present disclosure.
Figure 9:
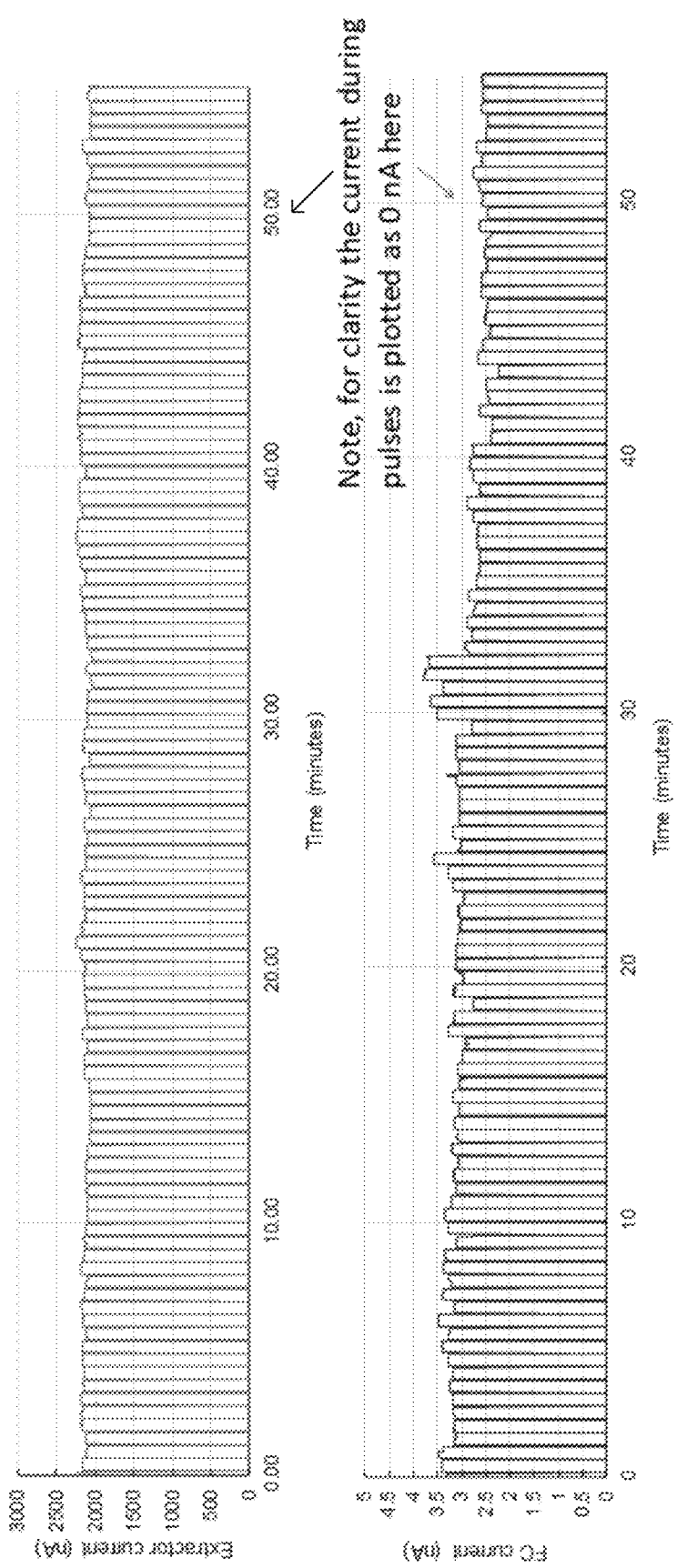
FIG. 9 are charts of extractor current over time with 500 ms width pulses every thirty seconds.

FIG. 8 is a flowchart of another method. At 500, an emitter that includes a protective cap layer disposed on an exterior surface of the emitter and an optional diffusion barrier is provided. The emitter has a diameter of 100 nm or less. The protective cap layer can include molybdenum and/or iridium, but other materials like ruthenium or boron are possible. At 501, an electric field is applied to the emitter. At 502, an electron beam is generated from the emitter. The emitter may operate in a vacuum of at least $10^{-9}$ Torr, such as from $5\times10^{-10}$ Torr to $5\times10^{-11}$ Torr, or even less than $5\times10^{-11}$ Torr, such as $10^{-12}$ Torr. At 503, the emitter is pulsed. For example, FIG. 9 shows charts of extractor current over time with 500 ms width pulses every thirty seconds. The FC current refers to current at a probe, such as a Faraday cup (FC). The extractor and probe currents can change value as a result of the voltage pulses, but the current then remains steady during the 30 seconds between pulses. The result is a series of current "steps" between pulses. The changes in the probe current between "steps" can be corrected with voltage feedback correction system to obtain a steady beam current.

Figure 10:
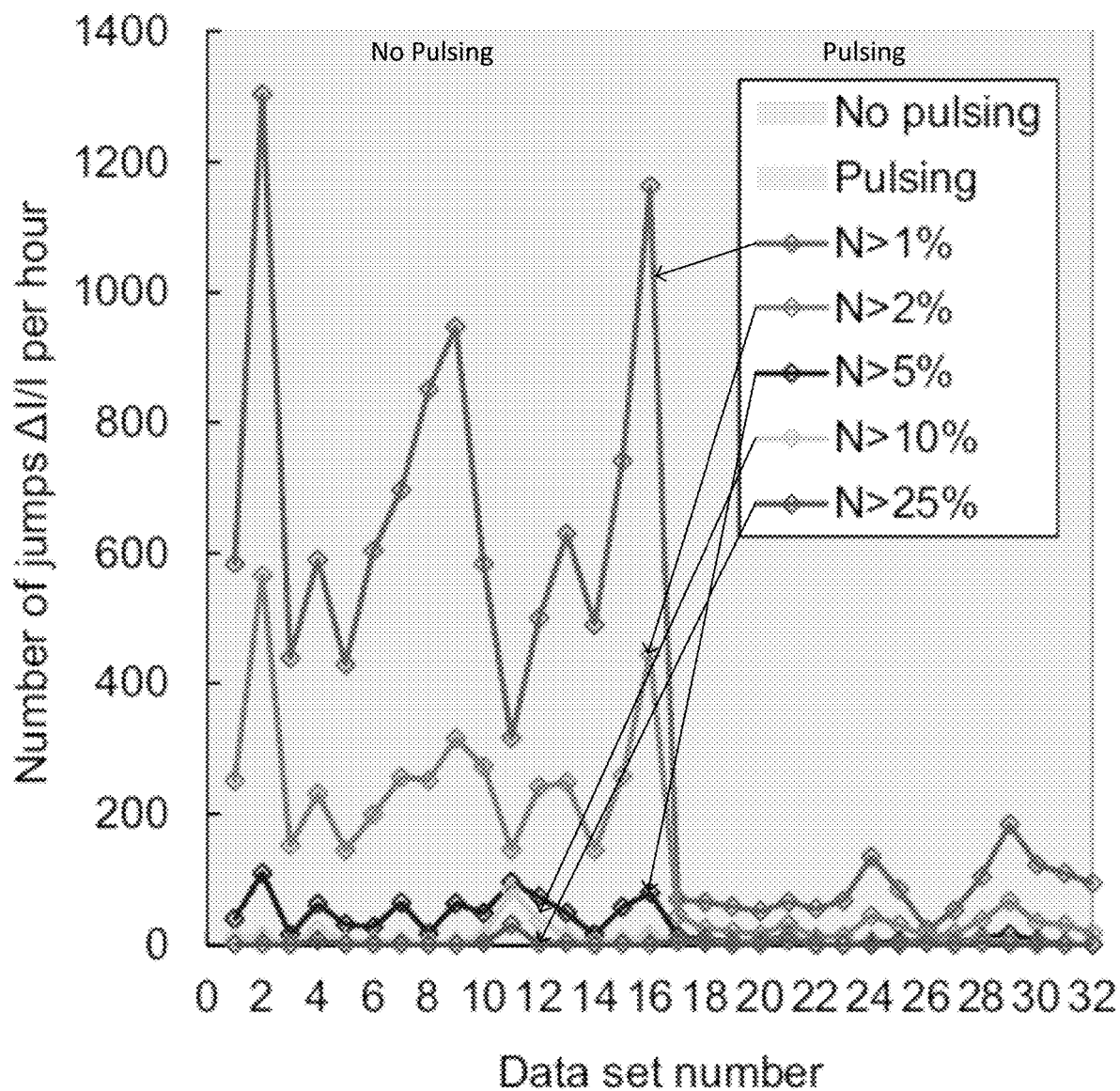
FIG. 10 is a chart comparing noise between steady and pulsed emission.

FIG. 10 is a chart comparing noise between steady and pulsed emission. Emission current can be stabilized by periodically pulsing the emitter to obtain beam current with noise levels less than 1% between pulses.

Pulsing an emitter periodically with a large current for a short period of time to clean the surface of the tips improves the stability of the field emission current during the time between pulses. The pulses can be applied periodically in an alternating sequence of steady emission and high current. Inspection of a wafer or metrology measurements may be interrupted during the high current periods, which may be from 100 microseconds up to 500 milliseconds. Pulses can be from for example, 100 to 500 microseconds or from 50 to 500 milliseconds. Pulsing the emitter can improve stability because molecules on the emitter are removed. This may be through heating or desorption.

In an example, the current was pulsed for 500 ms every 30 seconds. The current level fluctuates in a step function manner between pulses, but current between pulses is stable, and noise of less than 1% is seen in both the extractor and the Faraday currents in pulsed data sets.

Figure 15:
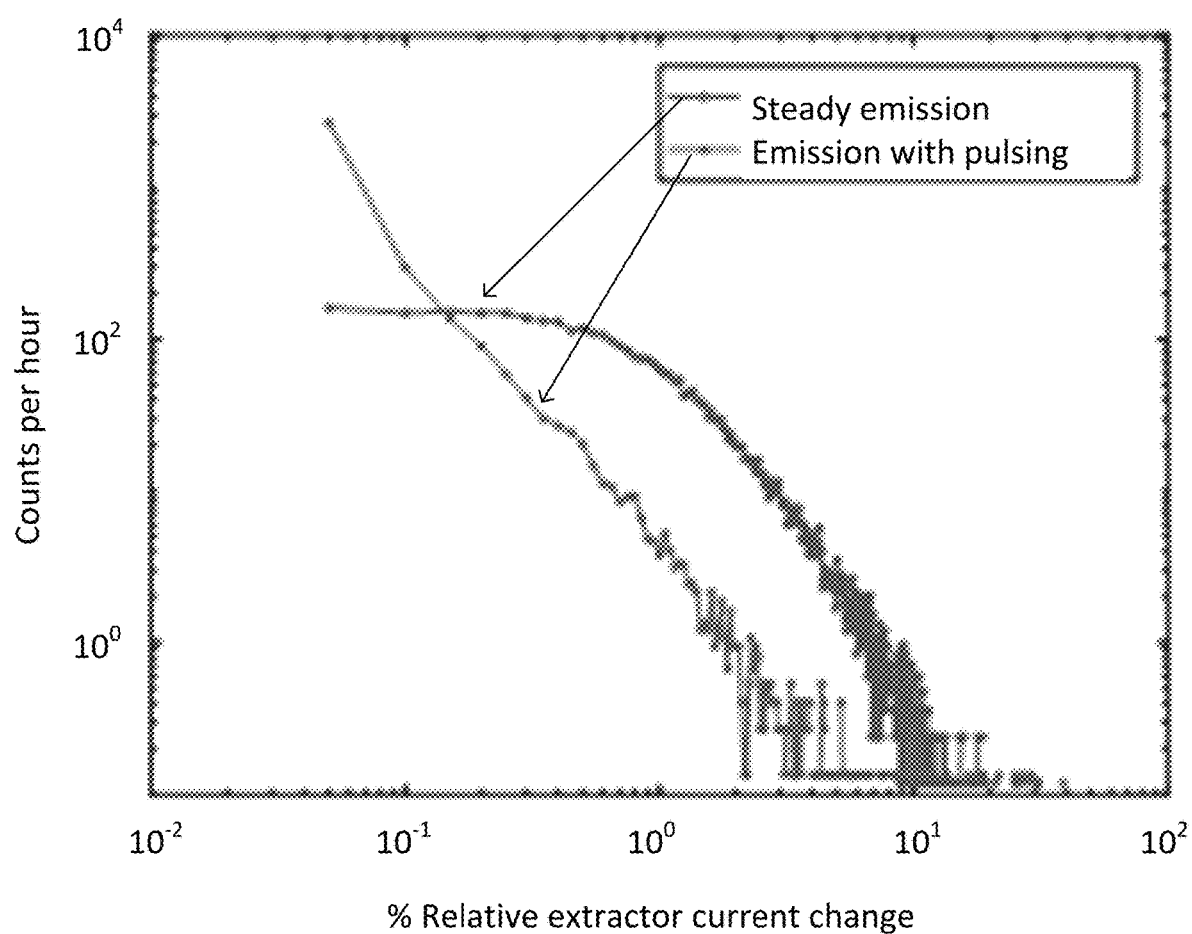
FIG. 15 is a chart comparing the counts per hour of percentage relative extractor current change ΔI/I between adjacent collected data points during 8 hours of steady field emission followed by 8 hours of field emission with pulsing for emitters coated with 5 nm ruthenium on 1 nm $B_4C$.

In an experiment, sets of data were collected from an emitter coated with 5 nm ruthenium on 1 nm $B_4C$, alternately measuring steady field emission for 8 hours, followed by 8 hours of field emission with pulsing (20-50 µA pulses for 500 ms every 30 seconds). Improvement in stability of pulsed emission over steady emission was observed, and emission instability returned after the pulsing is turned off. A plot of the counts per hour of percentage relative extractor current change $\Delta I/I$ between adjacent current data points during 8 hours of steady field emission, followed by 8 hours of field emission with pulsing is shown in FIG. 15.

When an emitter that has been emitting steadily for many hours is pulsed a single time to a high current for a short period of time, overall stability is improved. For emitters coated with ruthenium or other materials, a single pulse causes the emission current to increase by a factor of up to 13×, which corresponds to a drop in the work function at the emitting surface of up to 0.6 eV. After the pulse, it takes on average 5 hours for the current to return to the original current, which may be the time for adsorbates to adsorb again onto the surface of the emitter tip. The effects from pulsing are transient and therefore pulsing may need to be applied periodically to keep the emitting surface clean. In general, more stable emission is observed at lower vacuum pressures, and pulsing may need to be applied less frequently or with lower pulse currents with improved vacuum.

Additional experiments have shown that the effects of pulsing on emission stabilization improve with longer pulses and higher pulse currents.

Figure 11:
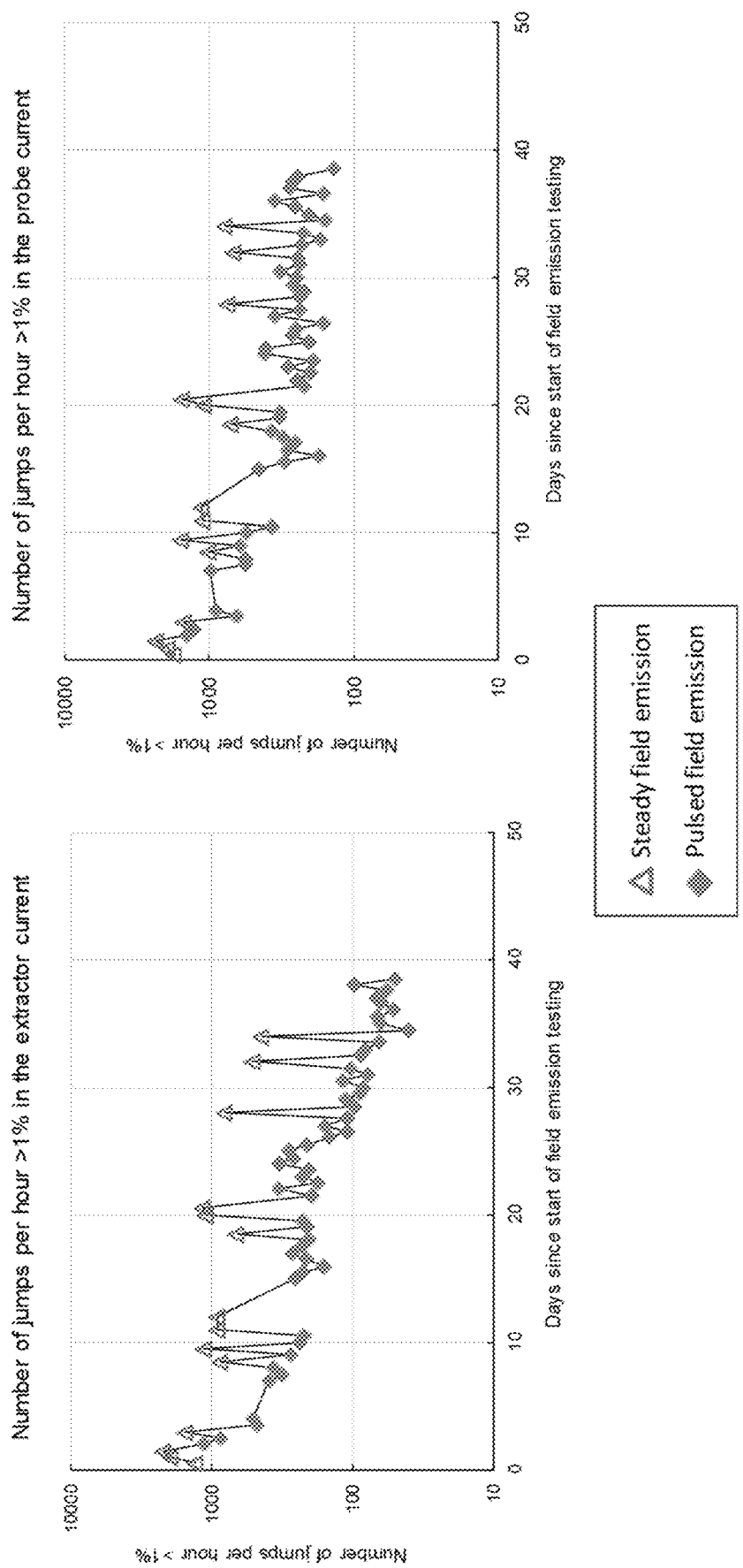
FIG. 11 compares stability of steady field emission and pulsed field emission for a 5 nm molybdenum coating on 1 nm niobium diffusion barrier on silicon.
Figure 12:
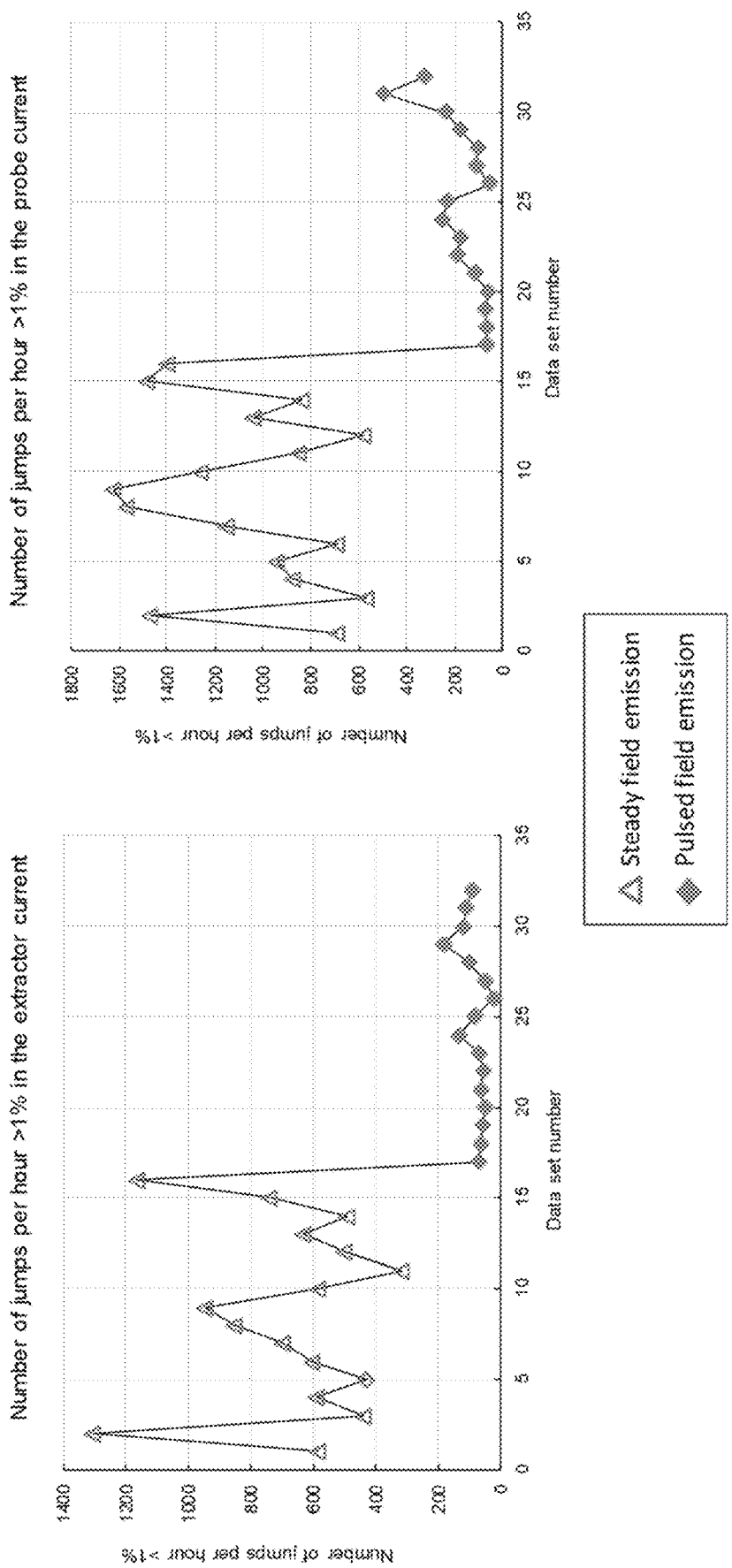
FIG. 12 compares stability of steady field emission and pulsed field emission for a 5 nm molybdenum coating on silicon.

Results of two experiments are shown. FIG. 11 compares stability of steady field emission and pulsed field emission for a 5 nm molybdenum coating on 1 nm niobium diffusion barrier on silicon. FIG. 12 compares stability of steady field emission and pulsed field emission for a 5 nm molybdenum coating on silicon.

Figure 13:
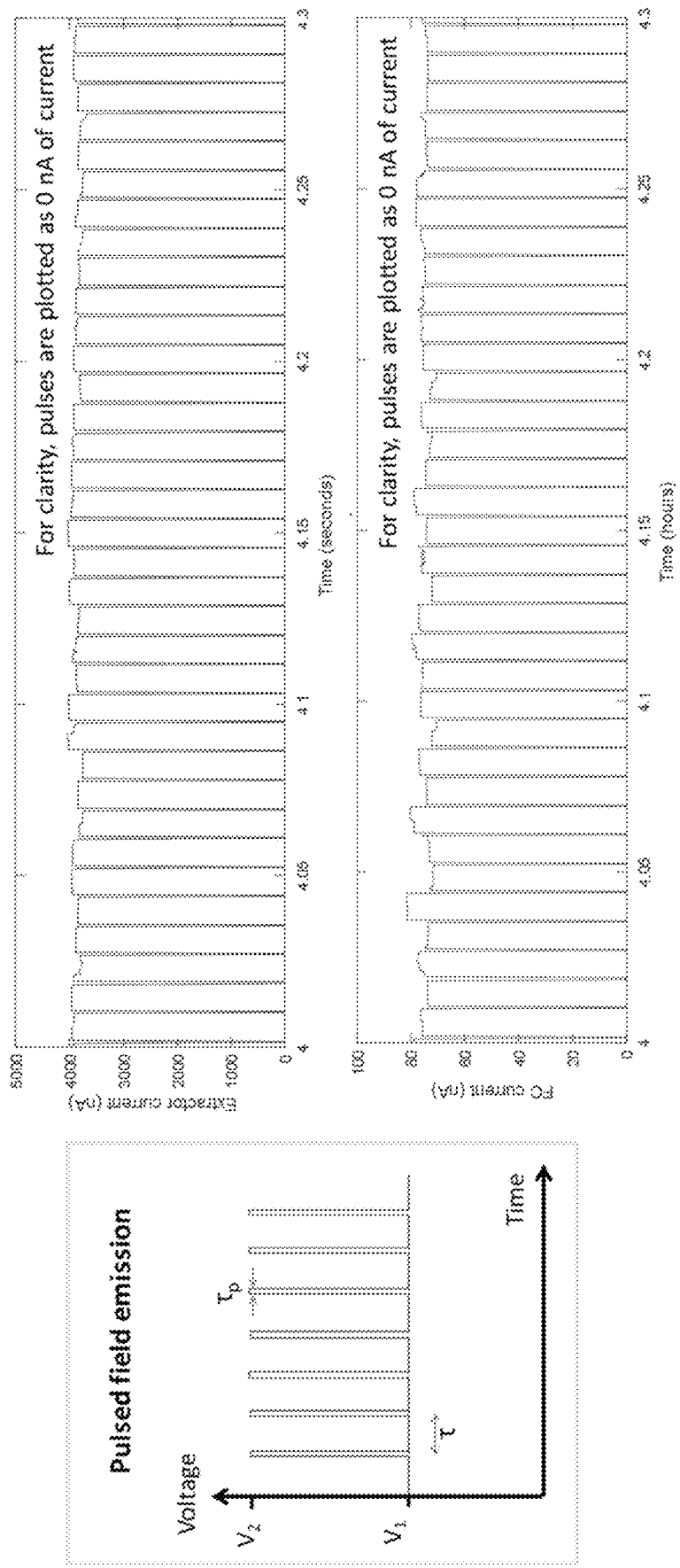
FIG. 13 illustrates pulsed field emission.

FIG. 13 illustrates pulsed field emission. Step function current changes between pulses, but the current is steady between pulses.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. An apparatus comprising:
an emitter, wherein the emitter has a diameter of 100 nm or less;
a protective cap layer disposed on an exterior surface of the emitter, wherein the protective cap layer includes molybdenum; and
a diffusion barrier between the emitter and the protective cap layer, wherein the diffusion barrier includes TiN, carbon, $B_4C$, or boron.

2. The apparatus of claim 1, wherein the emitter has a diameter of less than 15 nm.

3. The apparatus of claim 1, wherein the protective cap layer has a thickness from 1 nm to 20 nm.

4. The apparatus of claim 1, wherein the protective cap layer has fewer than $10^4$ impurities, and wherein the impurities include carbon, oxides, oxygen as a dissolved gas, sodium, or potassium.

5. The apparatus of claim 1, wherein the protective cap layer has a porosity less than or equal to 25%.

6. The apparatus of claim 1, wherein the protective cap layer has a packing density of greater than or equal to 0.92.

7. A system comprising an electron source that includes the emitter of claim 1, a stage, and a detector.

8. An apparatus comprising:
an emitter, wherein the emitter has a diameter of 100 nm or less;
a protective cap layer disposed on an exterior surface of the emitter, wherein the protective cap layer includes iridium; and
a diffusion barrier between the emitter and the protective cap layer, wherein the diffusion barrier includes TiN, carbon, $B_4C$, or boron.

9. The apparatus of claim 8, wherein the emitter has a diameter of less than 15 nm.

10. The apparatus of claim 8, wherein the protective cap layer has a thickness from 1 nm to 20 nm.

11. The apparatus of claim 8, wherein the protective cap layer has fewer than $10^4$ impurities, and wherein the impurities include carbon, oxides, oxygen as a dissolved gas, sodium, or potassium.

12. The apparatus of claim 8, wherein the protective cap layer has a porosity less than or equal to 25%.

13. The apparatus of claim 8, wherein the protective cap layer has a packing density of greater than or equal to 0.92.

14. A system comprising an electron source that includes the emitter of claim 8, a stage, and a detector.

15. A method comprising:
providing an emitter that includes a protective cap layer disposed on an exterior surface of the emitter, wherein the emitter has a diameter of 100 nm or less;
applying an electric field to the emitter;
generating an electron beam from the emitter; and
pulsing the emitter thereby removing adsorbates from the emitter.

16. The method of claim 15, wherein the protective cap layer includes molybdenum or iridium.

\* \* \* \* \*